United States Patent
Pan et al.

(10) Patent No.: US 10,210,939 B1
(45) Date of Patent: Feb. 19, 2019

(54) SOLID STATE STORAGE DEVICE AND DATA MANAGEMENT METHOD

(71) Applicants: Lite-On Electronics (Guangzhou) Limited, Guangzhou (CN); LITE-ON TECHNOLOGY CORPORATION, Taipei (TW)

(72) Inventors: Ya-Ping Pan, Taipei (TW); Po-Yen Chen, Taipei (TW); Min-I Hung, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/854,114

(22) Filed: Dec. 26, 2017

(30) Foreign Application Priority Data

Oct. 16, 2017 (CN) .......................... 2017 1 0960305

(51) Int. Cl.
| | |
|---|---|
| G11C 11/34 | (2006.01) |
| G11C 16/10 | (2006.01) |
| G11C 16/16 | (2006.01) |
| G11C 29/42 | (2006.01) |
| G06F 3/06 | (2006.01) |
| G06F 11/10 | (2006.01) |

(52) U.S. Cl.
CPC ............ G11C 16/105 (2013.01); G06F 3/064 (2013.01); G06F 3/0619 (2013.01); G06F 3/0679 (2013.01); G06F 11/108 (2013.01); G11C 16/16 (2013.01); G11C 29/42 (2013.01)

(58) Field of Classification Search
CPC ..... G11C 29/52; G11C 16/10; G11C 11/5628; G11C 11/40607; G11C 11/40615; G11C 14/009; G11C 16/3427; G11C 2029/0411; G11C 29/765; G11C 16/0483; G11C 16/28
USPC .... 365/185.18, 185.12, 185.21, 185.24, 200, 365/207, 63
See application file for complete search history.

(56) References Cited

U.S. PATENT DOCUMENTS

2018/0129430 A1*  5/2018  Kang .................... G06F 3/0619

* cited by examiner

*Primary Examiner* — Thong Q Le
(74) *Attorney, Agent, or Firm* — WPAT, PC

(57) ABSTRACT

A data management method for a solid state storage device is provided. The solid state storage device includes a memory cell array. The memory cell array is divided into first-portion logical blocks and second-portion logical blocks. The data management method includes the following steps. Firstly, a write data of plural pages from a host are stored into a first logical block of the first-portion logical blocks. Then, a specified operation is performed on the write data of the plural pages, so that a parity data is acquired. Then, the parity data is stored into a second logical block of the second-portion logical blocks.

10 Claims, 5 Drawing Sheets

| w | P0 | P1 | P2 | P3 | P4 | P5 | P6 | P7 |
| x | P0' | P1' | P2' | P3' | P4' | P5' | P6' | P7' |

(N-M) Logical Blocks

| y | $P_{p0}$ | $P_{p1}$ | $P_{p2}$ | $P_{p3}$ | $P_{p4}$ | $P_{p5}$ | $P_{p6}$ | $P_{p7}$ |

M Logical Blocks

| z | | | | | | | | $P_{pz}$ |

FIG. 4

SOLID STATE STORAGE DEVICE AND DATA MANAGEMENT METHOD

This application claims the benefit of People's Republic of China Patent Application No. 201710960305.0, filed Oct. 16, 2017, the subject matter of which is incorporated herein by reference.

FIELD OF THE INVENTION

The present invention relates to a solid state storage device and a control method, and more particularly to a solid state storage device and a data management method thereof.

BACKGROUND OF THE INVENTION

As is well known, solid state storage devices such as SD cards or solid state drives (SSD) are widely used in various electronic devices. Generally, a solid state storage device comprises a controlling circuit and a non-volatile memory. Moreover, the solid state storage device is also referred as a flash memory.

FIG. 1 is a schematic functional block diagram illustrating a conventional solid state storage device. As shown in FIG. 1, the solid state storage device 10 comprises a control circuit 101 and a memory cell array 105.

The solid state storage device 10 is connected with a host 14 through an external bus 12. Generally, the external bus 12 is a USB bus, an SATA bus, a PCIe bus, or the like. Moreover, the control circuit 101 is connected with the memory cell array 105 through an internal bus 113. According to a write command from the host 14, the control circuit 101 stores a write data from the host 14 to the memory cell array 105. According to a read command from the host 14, the control circuit 101 acquires a read data from the memory cell array 105. In addition, the read data is transmitted to the host 14 through the external bus 12.

The memory cell array 105 comprises plural memory cells. Each memory cell comprises a floating gate transistor. Depending on the data amount to be stored per memory cell, the memory cells may be classified into three types, i.e. a single-level cell (SLC), a multi-level cell (MLC) and a triple-level cell (TLC). The SLC can store only one bit of data per cell. The MLC can store two bits of data per cell. The TLC can store three bits of data per cell.

In case that the memory cell array has the same number of memory cells, the storage amount of the TLC memory cell array is eight times the storage amount of the SLC memory cell array.

FIG. 2 schematically illustrates a data layout of the memory cell array of the conventional solid state storage device. Generally, the memory cell array 105 is divided into plural blocks. Each block is divided into plural pages.

For example, as shown in FIG. 2, the memory cell array is an 8-channel, 1-chip enable memory cell array, which is also referred as the 8CH1CE memory cell array. The memory cell array is divided into N logical blocks. Each logical block is divided into 8 pages, which are indicated as P0~P7. For example, N is 1400. The storage capacity of each page is 256 Mbyte. Consequently, the storage capacity of the memory cell array is about 256 Gbyte. In addition, this memory cell array is a TLC memory cell array.

For assuring the data accuracy of the memory array, the last page in each logical block of the memory cell array 105 (i.e., P7) is used as a parity page for storing parity data.

While the control circuit 101 stores the write data into the memory cell array 105, the write data is stored into the first seven pages P0~P6 of each logical block only. Moreover, the control circuit 101 performs a specified operation on the data of the first seven pages. The result of the operation is used as parity data to be stored in the last page P7 (i.e., the parity page).

For example, after the control circuit 101 performs an XOR operation on the first bits of the data of the first seven pages P0~P6, the output value of the XOR operation is used as the first bit of the parity data. Similarly, after the control circuit 101 performs an XOR operation on the second bits of the data of the first seven pages P0~P6, the output value of the XOR operation is used as the second bit of the parity data. The rest may be deduced by analogy. Consequently, the parity data to be stored in the last page P7 (i.e., the parity page) is acquired by control circuit 101.

Moreover, the parity data in the parity page can be used to verify whether the data of the first seven pages in the logical block are erroneous or not. For example, a verify-after-write action will be described as follows.

After the control circuit 101 writes the data into the logical block, the verify-after-write action is performed. Meanwhile, the control circuit 101 reads all data in the logic block (i.e., the data of the pages P0~P7) in order to assure the accuracy of the write data.

If the output value of the XOR operation on the first bits of the data of the first seven pages P0~P6 is identical to the first bit of the parity data in the last page P7, the control circuit 101 confirms that all of the first bits of the data of the first seven pages are accurate. Similarly, if the output value of the XOR operation on the second bits of the data of the first seven pages P0~P6 is identical to the second bit of the parity data in the last page P7, the control circuit 101 confirms that all of the second bits of the data of the first seven pages are accurate. The rest may be deduced by analogy.

If the results of the XOR operation on the data of the first seven pages are all identical to the parity data in the last page, the control circuit 101 confirms that the data of the first seven pages are accurate. It means that the verify-after-write action passes. Whereas, if the results of the XOR operation on the data of the first seven pages are not identical to the parity data in the last page, the control circuit 101 judges that the data of the first seven pages are erroneous. It means that the verify-after-write action fails.

Besides, when the host 14 issues a read command to the control circuit 101 to read the data in a specified page of a logical block, the control circuit 101 has to read to all data from the logical block and verify whether the data of the specified page are accurate. After the control circuit 101 confirms that the data of the specified page are accurate, the control circuit 101 issues the data of the specified page to the host 14.

If the control circuit 101 judges that the data of the specified page are erroneous, the control circuit 101 performs the XOR operation to correct the data of the specified page. That is, the control circuit 101 performs the XOR operation to restore the data of the specified page according to the data of the other seven pages, including the parity data in the last page, in the logical block.

As mentioned above, the last page of each logical block in the memory cell array 105 of the solid state storage device 10 is used as the parity page for storing parity data. In the memory cell array of FIG. 2, the parity strip ratio is 1:7.

As known, the parity page occupies the storage space of the write data from the host. For saving the storage space of the parity page, the data layout of the memory cell array should be modified. FIG. 3 schematically illustrates another data layout of the memory cell array of the conventional solid state storage device. For example, as shown in FIG. 3, the memory cell array is an 8-channel, 2-chip enable memory cell array, which is also referred as the 8CH2CE memory cell array. The storage amount of the memory cell array as shown in FIG. 3 is two times the storage amount of the memory cell array as shown in FIG. 2.

The memory cell array is divided into N logical blocks. Each logical block is divided into 16 pages, which are indicated as P0~P15. For example, N is 1400. The storage capacity of each page is 256 Mbyte. Consequently, the storage capacity of the memory cell array is about 512 Gbyte. In addition, this memory cell array is a TLC memory cell array.

Similarly, for assuring the data accuracy of the memory array, the last page in each logical block of the memory cell array 105 (i.e., P15) is used as a parity page for storing parity data. In the memory cell array of FIG. 3, the parity strip ratio is 1:15.

In the memory cell array of FIG. 3, the storage space of the parity page is saved. However, the control circuit 101 has to read to all pages P0~P15 from the logical block to verify whether the data of the specified page are accurate through the XOR operation, or to perform the XOR operation to restore the data of the specified page. Since the amount of data to be read by the control circuit increases, the time period for performing the verifying process or the time period of restoring the data is extended.

An 8-channel, 4-chip enable memory cell array, which is also referred as the 8CH4CE memory cell array, is another type of memory cell array. Each logical block is divided into 32 pages, which are indicated as P0~P31. The storage capacity of the memory cell array is about 1024 Gbyte. The parity strip ratio of this memory cell array is 1:31.

As mentioned above, the storage space of the conventional memory cell array is influenced by the parity page. In the memory cell array of FIG. 2, one-eighth of the storage space is not used for storing the write data from the host. In the memory cell array of FIG. 3, one-sixteenth of the storage space is not used for storing the write data from the host.

SUMMARY OF THE INVENTION

An embodiment of the present invention provides a data management method for a solid state storage device. The solid state storage device includes a memory cell array. The memory cell array is divided into first-portion logical blocks and second-portion logical blocks. The data management method includes the following steps. Firstly, a write data of plural pages from a host are stored into a first logical block of the first-portion logical blocks. Then, a specified operation is performed on the write data of the plural pages, so that a parity data is acquired. Then, the parity data is stored into a second logical block of the second-portion logical blocks.

Another embodiment of the present invention provides a solid state storage device. The solid state storage device includes a control circuit and a memory cell array. The control circuit is connected with a host to receive a write data of plural pages from the host. The memory cell array is connected with the control circuit. The memory cell array is divided into first-portion logical blocks and second-portion logical blocks. The control circuit stores the write data of the plural pages into a first logic block of the first-portion logical blocks and stores a parity data into a second logical block of the second-portion logical blocks. The control circuit performs a specified operation on the write data of the plural pages to acquire the parity page.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4 schematically illustrates a data layout of a memory cell array of a solid state storage device according to a first embodiment of the present invention;

DETAILED DESCRIPTION OF PREFERRED EMBODIMENTS

Figure 1:
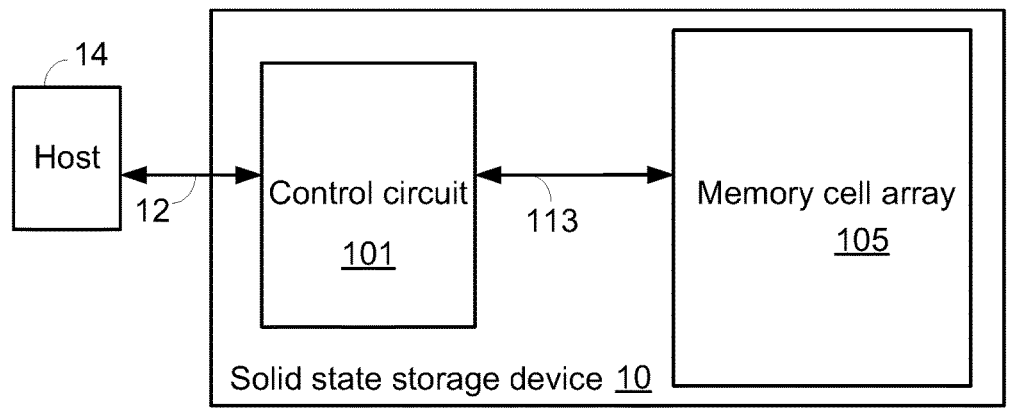
FIG. 1 (prior art) is a schematic functional block diagram illustrating a conventional solid state storage device.
Figure 2:
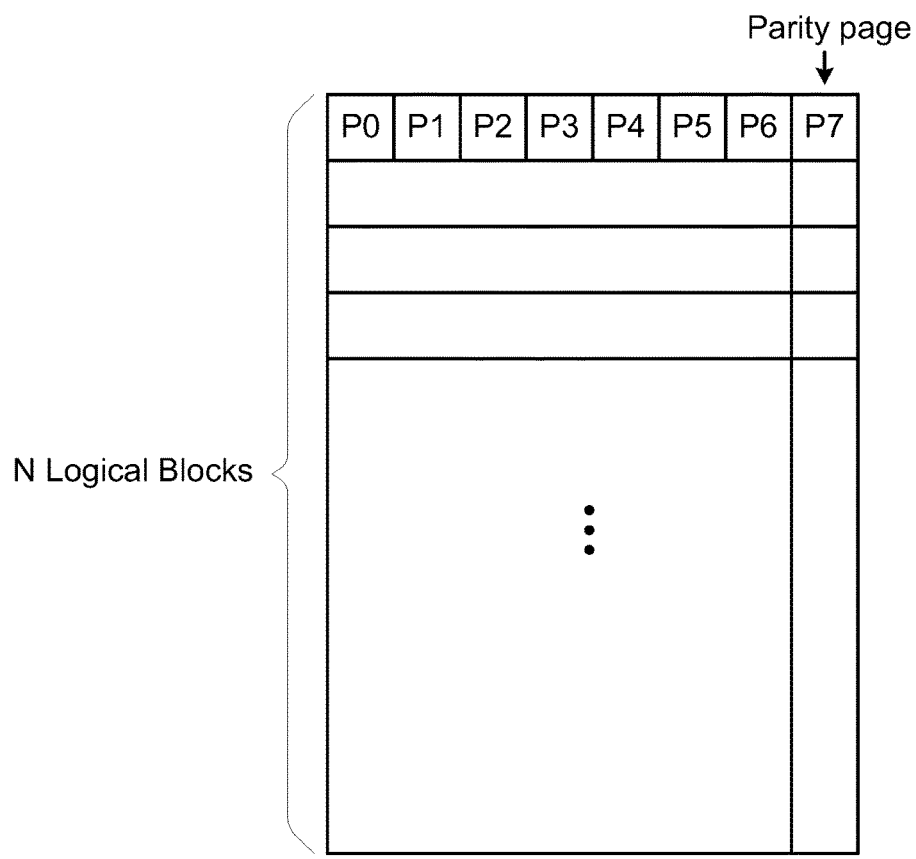
FIG. 2 (prior art) schematically illustrates a data layout of the memory cell array of the conventional solid state storage device.
Figure 3:
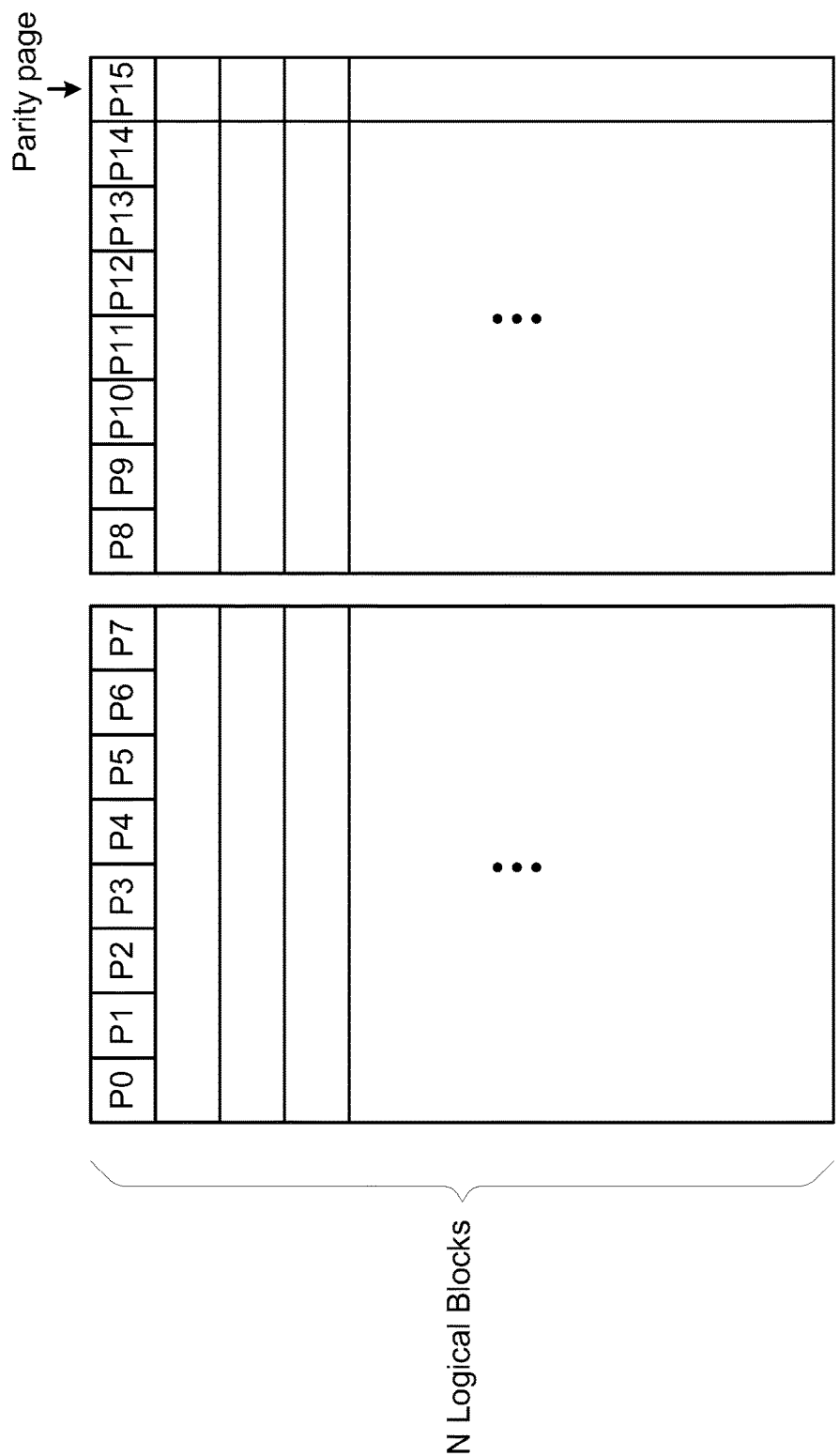
FIG. 3 (prior art) schematically illustrates another data layout of the memory cell array of the conventional solid state storage device.

The present invention provides a solid state storage device and a data management method for the solid state storage device. The architecture of the solid state storage device is similar to that of FIG. 1. That is, the solid state storage device also comprises a control circuit 101 and a memory cell array 105. In accordance with the present invention, the memory cell array has a novel data layout. Consequently, the memory cell array can provide more storage space to store the write data from the host 14.

FIG. 4 schematically illustrates a data layout of a memory cell array of a solid state storage device according to a first embodiment of the present invention. The memory cell array 105 is divided into plural blocks. Each block is divided into plural pages. In this embodiment, the plural blocks are classified into two portions. The first-portion logical blocks are used for storing the write data from the host. The second-portion logical blocks are used for storing the parity data.

For example, the memory cell array as shown in FIG. 4 is an 8CH1CE memory cell array. The memory cell array is divided into N logical blocks. The (N-M) logical blocks (i.e., the first-portion logical blocks) are used for storing the write data from the host. The M logical blocks (i.e., the second-portion logical blocks) are used for storing the parity data of the parity page. Each logical block is divided into 8 pages. For example, N is 1400, and M is 30. The storage capability of each page is 256 Mbyte. Consequently, the storage capacity of the memory cell array is about 256 Gbyte. In addition, this memory cell array is a TLC memory cell array.

While the control circuit 101 stores the write data into the memory cell array 105, the write data is stored into the first-portion logical blocks, i.e., the 8 pages of each logical block. Moreover, after the control circuit 101 performs a specified operation on the data of the 8 pages of the logical block, a page of the parity data is generated. The page of the parity data is stored in a page of the second-portion logical blocks. In other words, the pages of the second-portion logical blocks are used as parity pages for storing parity data.

Please refer to FIG. 4 again. While the control circuit 101 stores the write data from the host 14 into the memory cell array 105, the write data is stored in the 8 pages P0~P7 of the w-th logical block. The w-th logical block is one block among the (N-M) logical blocks (i.e., the first-portion logical blocks). After the control circuit 101 performs a specified operation on the data of the 8 pages P0~P7 of the w-th logical block, a page of parity data is generated. The page of the parity data is stored in a page (e.g., $P_{P0}$) of the y-th logical block. The y-th logical block is one block among the M logical blocks (i.e., the second-portion logical blocks).

For example, after the control circuit 101 performs an XOR operation on the first bits of the data of the 8 pages P0~P7, the output value of the XOR operation is used as the first bit of the parity data in the parity page $P_{P0}$. Similarly, after the control circuit 101 performs the XOR operation on the second bits of the data of the 8 pages P0~P7, the output value of the XOR operation is used as the second bit of the parity data in the parity page $P_{P0}$. The rest may be deduced by analogy. After the computing operation is completed, the parity data to be stored in the parity page $P_{P0}$ is acquired by control circuit 101 and written into the parity page $P_{P0}$ of the y-th logical block.

Similarly, while the control circuit 101 continuously stores the write data from the host 14 into the memory cell array 105, the write data is stored in the 8 pages of another logical block of the first-portion logical blocks, for example the 8 pages P0'~P7' of the x-th logical block. After the control circuit 101 performs a specified operation on the data of the 8 pages P0'~P7' of the x-th logical block, a page of a parity page is generated. The page of the parity data is stored in a page (e.g., $P_{P1}$) of the y-th logical block of the second-portion logical blocks.

As mentioned above, the first-portion logical blocks of the memory cell array 105 are used for storing the write data from the host 14, and the second-portion logical blocks of the memory cell array 105 are used for storing the parity data. In the memory cell array 105 of FIG. 4, the parity strip ratio is 1:8.

Moreover, the parity data in the parity page can be used to verify whether the data of the corresponding eight pages in the logical block are erroneous or not. For example, a verify-after-write action will be described as follows After the data is written into the w-th logical block and the page $P_{P0}$ of the y-th logical block, the control circuit 101 performs the verify-after-write action. Meanwhile, the control circuit 101 reads all data in the w-th logic block (i.e., the data of the pages P0~P7) and the parity data in the parity page $P_{P0}$ in order to assure the accuracy of the write data.

If the control circuit 101 confirms that the data of the read 8 pages are accurate, it means that the verify-after-write action passes. Whereas, if the control circuit 101 judges that the data of the read 8 pages are erroneous, it means that the verify-after-write action fails.

That is, after the control circuit 101 stores the write data into the first-portion logical blocks, a corresponding parity data is generated and stored in the second-portion logical blocks. Then, the control circuit 101 performs the verify-after-write action. After the control circuit continuously stores the write data into the first-portion logical blocks, the corresponding parity data is generated and stored in the second-portion logical blocks.

As known, the storage space of the second-portion logical blocks is limited. When the second-portion logical blocks are full and fails to store subsequent parity data, the control circuit 101 performs a block erasing action to generate a blank logic block to store the subsequent parity data. Please refer to FIG. 4 again. After the parity data is written into the last page $P_{Pz}$ of the z-th logical block of the second-portion logical blocks, the second-portion logical blocks have no space for storing the subsequent parity data. Meanwhile, the control circuit 101 erases the y-th logical block as the blank logical block and stores the subsequent parity data into the y-th logical block. Similarly, after the blank logical block completely stored by the parity data, the control circuit 101 performs the block erasing action again to generate a new blank logic block and stores the subsequent parity data.

That is, if the second-portion logical blocks have no space for storing the subsequent parity data, the data that has been earlier stored in the second-portion logical blocks will be erased and the erased logical block is used for storing the subsequent parity data. In other words, the second-portion logical blocks have the function of a ring buffer.

In the data management method of the first embodiment, the fraction of the storage space of the memory cell array that is not used for storing the write data from the host is M/N. In case that N is 1400 and M is 30, only 3/140 of the storage space of the memory cell array is not used for storing the write data from the host. Obviously, the memory cell array of the present invention can store more write data from the host.

Moreover, the parity strip ratio may be set by considering the amount of data needs to be read for the verifying process. For example, the parity strip ratio is set as 1:8. Accordingly, the memory cell array of the present invention can store more write data from the host, also the time period for performing the verifying process is not extended.

Figure 5:
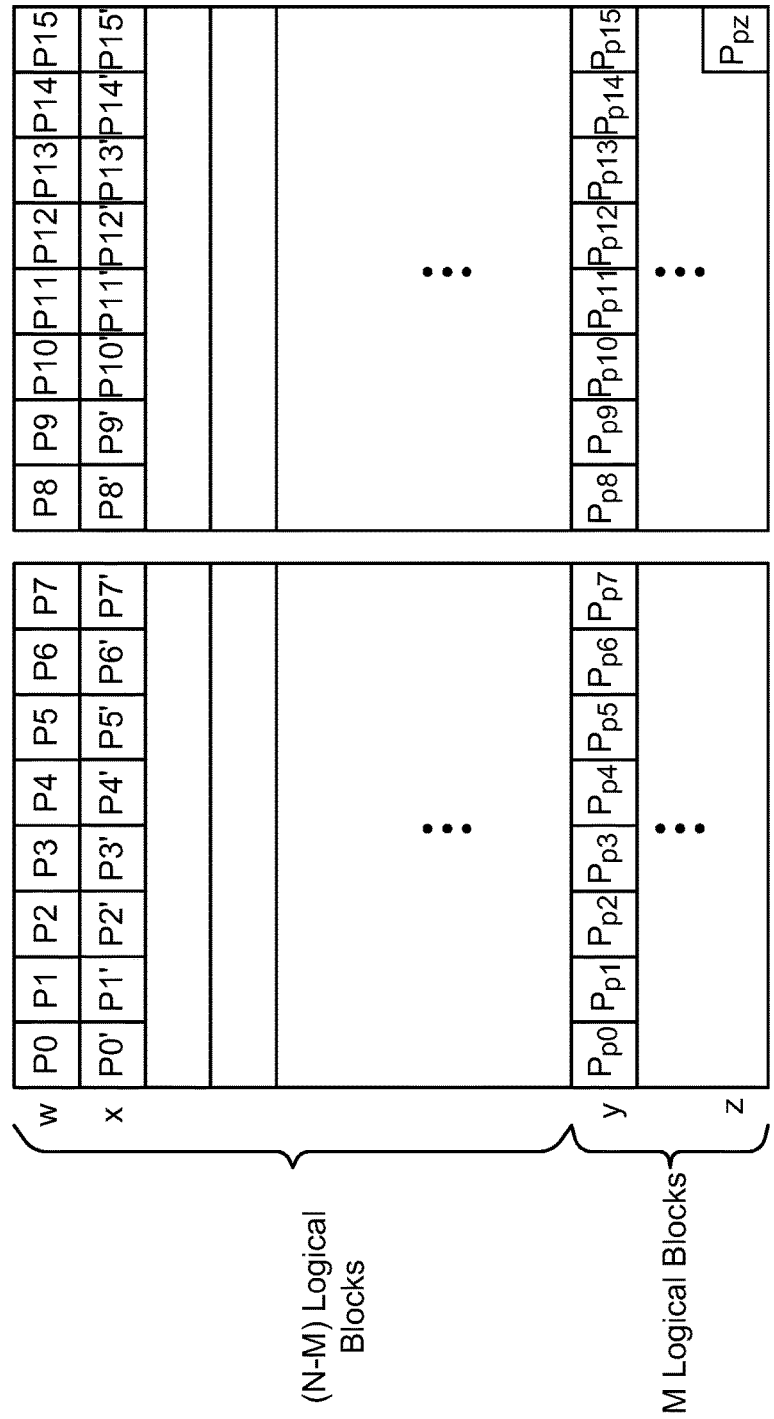
FIG. 5 schematically illustrates a data layout of a memory cell array of a solid state storage device according to a second embodiment of the present invention.

FIG. 5 schematically illustrates a data layout of a memory cell array of a solid state storage device according to a second embodiment of the present invention. For example, the memory cell array as shown in FIG. 5 is an 8CH2CE memory cell array.

The memory cell array is divided into N logical blocks. The (N-M) logical blocks (i.e., the first-portion logical blocks) are used for storing the write data from the host. The M logical blocks (i.e., the second-portion logical blocks) are used for storing the parity data. Each logical block is divided into 16 pages P0~P15. For example, N is 1400, and M is 30. The storage capability of each page is 256 Mbyte. Consequently, the storage capacity of the memory cell array is about 512 Gbyte.

While the control circuit 101 stores the write data into the memory cell array 105, the write data is stored into the first-portion logical blocks. Moreover, after the control circuit 101 performs a specified operation on the write data stored in the first-portion logical block, a page of parity data is generated. The page of parity data is stored in a page of the second-portion logical blocks. In other words, the pages of the second-portion logical blocks are used as parity pages for storing parity data.

In this embodiment, the parity strip ratio is set, e.g., 1:8, by considering the amount of data needs to be read for the verifying process. The control circuit 101 generates the parity data according to the parity strip ratio.

While the control circuit 101 stores the write data from the host 14 into the memory cell array 105, the write data is firstly stored in the 8 pages P0~P7 of the w-th logical block. The w-th logical block is one block among the (N-M) logical blocks (i.e., the first-portion logical blocks). After the control circuit 101 performs a specified operation on the data of the 8 pages P0~P7 of the w-th logical block, a page of parity data is generated. The page of parity data is stored in a page (e.g., $P_{P0}$) of the y-th logical block. The y-th logical block is one block among the M logical blocks (i.e., the second-portion logical blocks).

While the control circuit 101 continuously stores the write data from the host 14 into the memory cell array 105, the write data is stored in the other 8 pages P8~P15 of the w-th logical block. After the control circuit 101 performs a specified operation on the data of the pages P8~P15 of the w-th logical block, a page of parity data is generated. The page of parity data is stored in a page (e.g., $P_{P1}$) of the y-th logical block.

Similarly, while the control circuit 101 continuously stores the write data from the host 14 into the memory cell array 105, the write data is stored in the 8 pages P0'~P7' of the x-th logical block. The x-th logical block is one block among the (N-M) logical blocks (i.e., the first-portion logical blocks). After the control circuit 101 performs a specified operation on the data of the 8 pages P0'~P7' of the x-th logical block, a page of parity data is generated. The page of parity data is stored in a page (e.g., $P_{P2}$) of the y-th logical block. The rest may be deduced by analogy.

In other words, according to the concepts of the present invention, the parity strip ratio for the memory cell array 105 of the solid state storage device can be set as the same value (e.g., 1:8) for different memory cell array, i.e. an 8CH1CE memory cell array or an 8CH2CE memory cell array.

Similarly, the control circuit 101 performs the verify-after-write action according to the parity data. The way of performing the verify-after-write action is described as above, and is not redundantly described herein.

As known, the storage space of the second-portion logical blocks is limited. After the second-portion logical blocks are full and fails to store subsequent parity data, the control circuit 101 performs a block erasing action to generate a blank logic block to store the subsequent parity data. For example, after the parity data is written into the last page $P_{Pz}$ of the z-th logical block of the second-portion logical blocks, the second-portion logical blocks have no space for storing the subsequent parity data. Meanwhile, the control circuit 101 erases the y-th logical block as the blank logical block to store the subsequent parity data into the y-th logical block. Similarly, after the blank logical block completely stored by the parity data, the control circuit 101 performs the block erasing action again to generate a new blank logic block to store the subsequent parity data. In other words, the second-portion logical blocks have the function of a ring buffer.

In the data management method of the second embodiment, the fraction of the storage space of the memory cell array that is not used for storing the write data from the host is M/N. In case that M is 1400 and N is 30, only 3/140 of the storage space of the memory cell array is not used for storing the write data from the host. Obviously, the memory cell array of the present invention can store more write data from the host.

From the above descriptions, the storage space of the solid state storage device 10 for storing the write data from the host 14 is determined according to the ratio M/N of the first-portion logical blocks to the second-portion logical blocks. Moreover, the amount of data to be read in the verifying process of the solid state storage device 10 is determined according to the parity strip ratio. In the data management method of the present invention, the storage space of the solid state storage device 10 for storing the write data from the host 14 is not influenced by the parity strip ratio. Consequently, more space for storing the write data is retained, and the time period for performing the verifying process or the time period of restoring the data is shortened.

In another embodiment, the method of programming the memory cell may be modified to assure the accuracy of the parity page.

Figure 6:
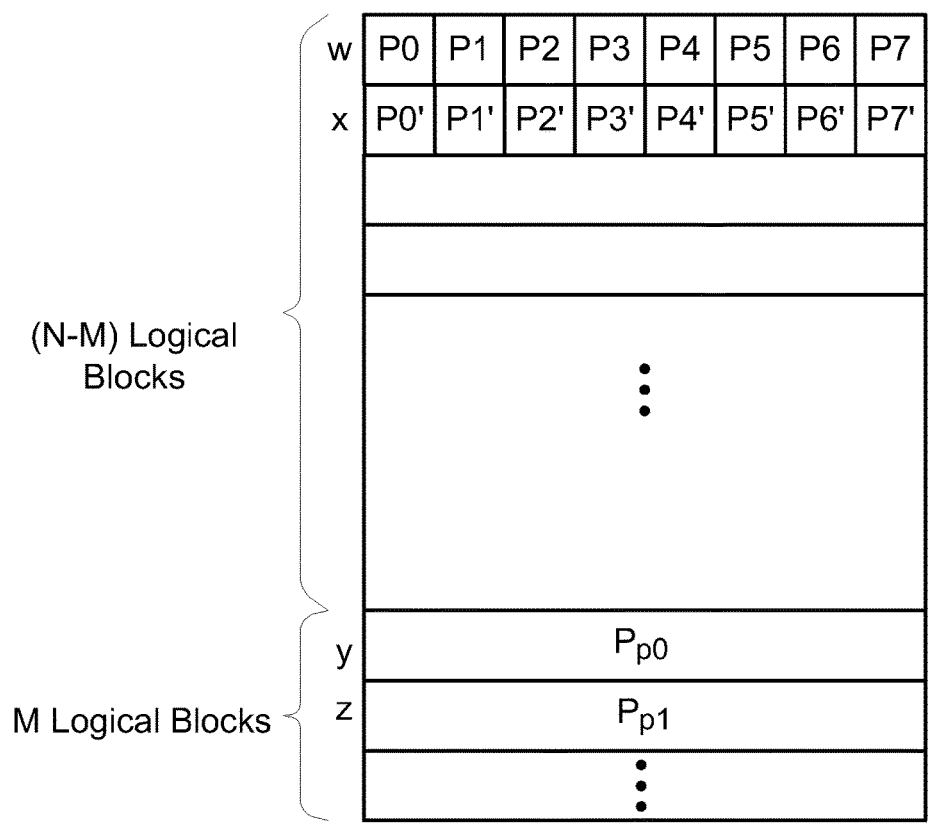
FIG. 6 schematically illustrates a data layout of a memory cell array of a solid state storage device according to a third embodiment of the present invention.

FIG. 6 schematically illustrates a data layout of a memory cell array of a solid state storage device according to a third embodiment of the present invention. For example, the memory cell array as shown in FIG. 6 is an 8CH1CE memory cell array.

In comparison with the first embodiment, the method of programming the SLC memory cell is employed to write data into the second-portion logical blocks. That is, the method of programming the TLC memory cell is employed to write data into the first-portion logical blocks, and the method of programming the SLC memory cell is employed to write data into the second-portion logical blocks.

As mentioned above, the storage amount of the TLC memory cell array is eight times the storage amount of the SLC memory cell array. Consequently, each of the second-portion logical blocks is capable of storing one page of data only.

While the control circuit 101 stores the write data from the host 14 into the memory cell array 105, the write data is firstly stored in the 8 pages P0~P7 of the w-th logical block according to the method of programming the TLC memory cell. After the control circuit 101 performs a specified operation on the data of the 8 pages P0~P7 of the w-th logical block, a page of parity data is generated. The page of parity data is stored in a page (e.g., $P_{P0}$) of the y-th logical block according to the method of programming the SLC memory cell.

Similarly, while the control circuit 101 continuously stores the write data from the host 14 into the memory cell array 105, the write data is stored in the 8 pages P0'~P7' of the x-th logical block according to the method of programming the TLC memory cell. After the control circuit 101 performs a specified operation on the data of the 8 pages P0'~P7' of the x-th logical block, a page of parity data is generated. The page of parity data is stored in a page (e.g., $P_{P1}$) of the z-th logical block according to the method of programming the SLC memory cell. The rest may be deduced by analogy.

Since the parity data is written into the logical block according to the method of programming the SLC memory cell, the data accuracy of the parity data is enhanced. That is, after the verify-after-write action is performed, the accuracy of the write data is increased.

From the above descriptions, the present invention provides a solid state storage device and a data management method. The write data from the host and the corresponding parity data are stored into different logical blocks. Consequently, the memory cell array can store more write data from the host.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A data management method for a solid state storage device, the solid state storage device comprising a memory cell array, the memory cell array being divided into plural logical blocks, each logical block being divided into plural logical pages, the plural logical blocks being classified into first-portion logical blocks and second-portion logical blocks, the data management method comprising steps of:
    allowing a write data of plural pages from a host to be stored into a first logical block of the first-portion logical blocks;
    generating a parity data corresponding to the write data of the plural pages; and
    storing the parity data into a second logical block of the second-portion logical blocks, wherein the second logical block is different from the first logical block.

2. The data management method as claimed in claim 1, wherein the plural pages are 8 pages for storing in the first logic block of the first-portion logical blocks, and a parity strip ratio of the memory cell array is 1:8.

3. The data management method as claimed in claim 1, wherein the write data of the plural pages from the host are stored into the first logical block of the first-portion logical blocks according to a method of programming a triple-level cell, and the parity data is stored into the second logical block of the second-portion logical blocks according to a method of programming a single-level cell.

4. The data management method as claimed in claim 1, further comprising a step of performing an erasing action to erase at least one logical block of the second-portion logical blocks when the second-portion logical blocks are fully stored.

5. The data management method as claimed in claim 1, wherein the second-portion logical blocks are used as a ring buffer.

6. A solid state storage device, comprising:
    a control circuit connected with a host to receive a write data of plural pages from the host; and
    a memory cell array connected with the control circuit, wherein the memory cell array is divided into plural logical blocks, each logical block is divided into plural logical pages, and the plural logical blocks are classified into first-portion logical blocks and second-portion logical blocks,
    wherein the control circuit stores the write data of the plural pages into a first logic block of the first-portion logical blocks and stores a parity data into a second logical block of the second-portion logical blocks, wherein the parity data is generated corresponding to the write data of the plural pages, and the second logical block is different from the first logical block.

7. The solid state storage device as claimed in claim 6, wherein the plural pages are 8 pages for storing in the first logic block of the first-portion logical blocks, and a parity strip ratio of the memory cell array is 1:8.

8. The solid state storage device as claimed in claim 6, wherein the write data of the plural pages from the host are stored into the first logical block of the first-portion logical blocks by the control circuit according to a method of programming a triple-level cell, and the parity data is stored into the second logical block of the second-portion logical blocks by the control circuit according to a method of programming a single-level cell.

9. The solid state storage device as claimed in claim 6, wherein the second-portion logical blocks are used as a ring buffer.

10. The solid state storage device as claimed in claim 6, wherein when the second-portion logical blocks are fully stored, the control circuit performs an erasing action to erase at least one logical block of the second-portion logical blocks.

* * * * *